(12) United States Patent
Reese

(10) Patent No.: US 6,388,317 B1
(45) Date of Patent: May 14, 2002

(54) SOLID-STATE CHIP COOLING BY USE OF MICROCHANNEL COOLANT FLOW

(75) Inventor: Robert Michael Reese, Philadelphia, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 36 days.

(21) Appl. No.: 09/669,468

(22) Filed: Sep. 25, 2000

(51) Int. Cl.$^7$ ............................................... H01L 23/34
(52) U.S. Cl. ........................ 257/713; 257/714; 257/721
(58) Field of Search ................................. 257/713, 716, 257/721, 714

(56) References Cited

U.S. PATENT DOCUMENTS 5,130,768 A * 7/1992 Wu et al.
5,801,924 A * 9/1998 Salmonson

* cited by examiner

Primary Examiner—David E. Graybill
(74) Attorney, Agent, or Firm—Duane Morris LLP

(57) ABSTRACT

A cooling arrangement useful for semiconductors or solid-state assemblages mounts the semiconductor or other solid-state device directly onto a first surface of a thermally conductive "heat spreader." The heat spreader contains microchannels which open into coolant fluid ports on the second side of the heat spreader. The heat spreader, in turn, is mounted on a coolant fluid distribution or circulation plate. In one embodiment, the coolant fluid distribution plate also includes a micropump for circulating coolant fluid through the microchannels of the heat spreader. In another embodiment, the coolant fluid distribution plate simply distributes coolant applied to its fluid input port to those heat spreaders mounted thereon, and a plurality of coolant fluid distribution plates are mounted on a coolant fluid circulation plate, which uses a micropump to circulate coolant fluid to the various distribution plates and ultimately to the heat spreaders. Thus, coolant fluid is communicated directly into the support for the semiconductor chip or other solid-state device, for good heat transfer with low temperature drop.

(178)

10 Claims, 8 Drawing Sheets

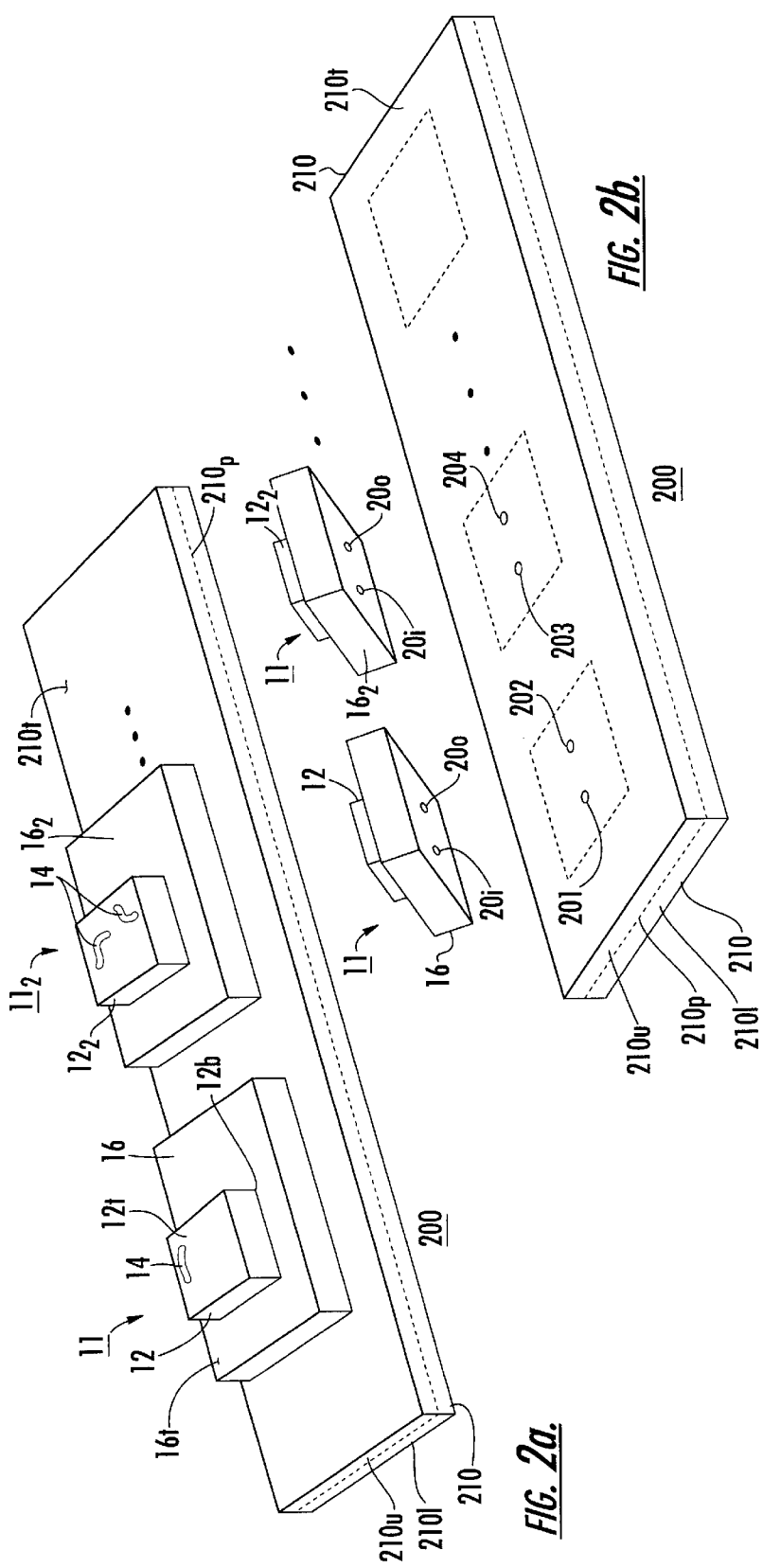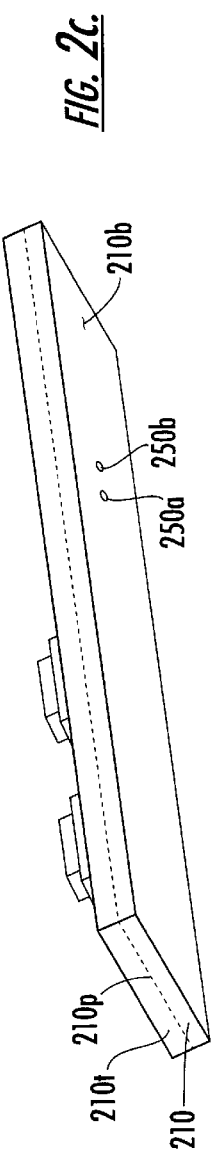

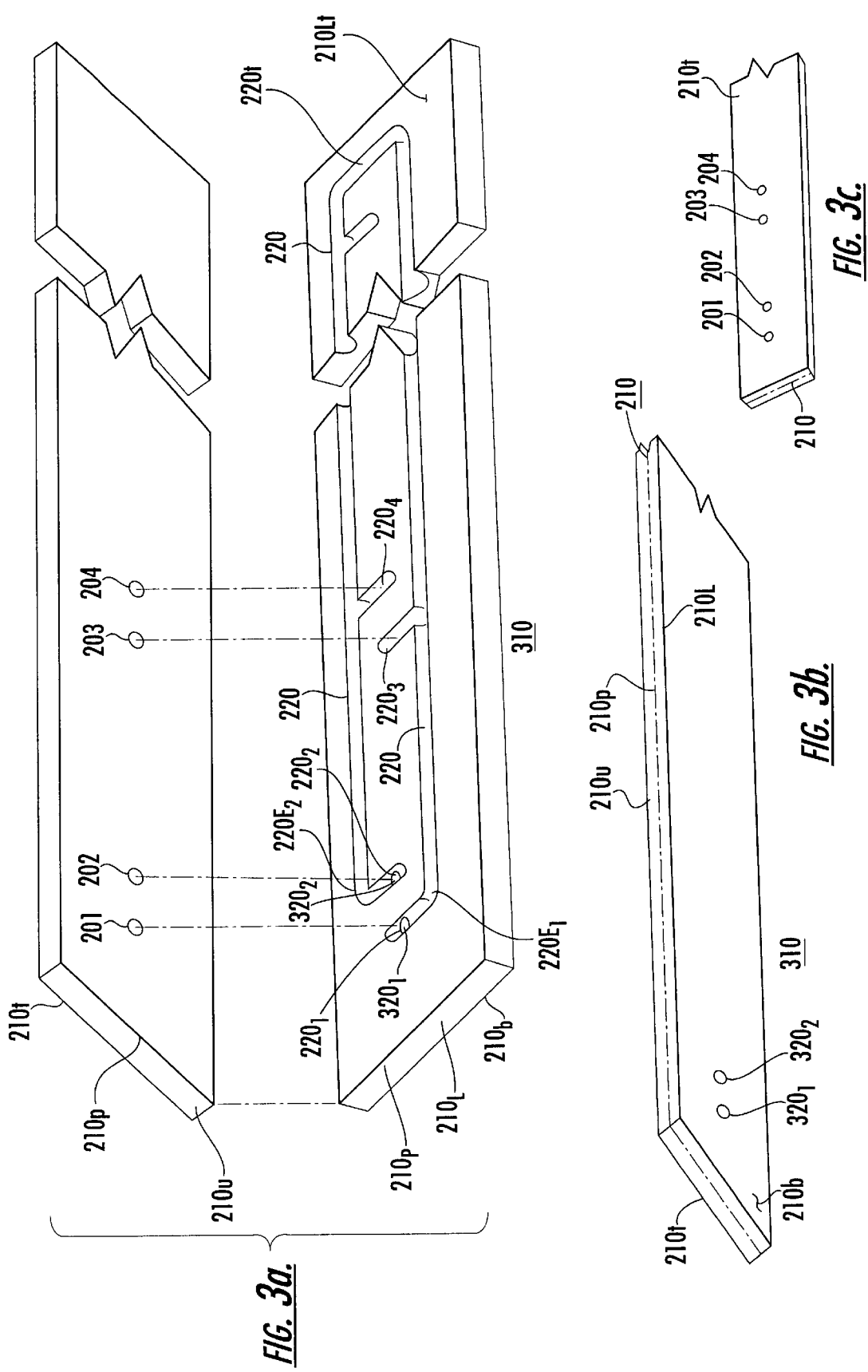

SOLID-STATE CHIP COOLING BY USE OF MICROCHANNEL COOLANT FLOW

FIELD OF THE INVENTION

This invention relates to cooling arrangements for semiconductor devices, and more particularly to cooling arrangements using circulating fluid coolant.

BACKGROUND OF THE INVENTION

The history of communications and of computing is a continuing saga of increasing power densities as increased transmitted power is sought in conjunction with shorter and shorter wavelengths, and as the path lengths in microprocessors are reduced in conjunction with increasing numbers of processing elements.

In the field of communications and radar, it is desirable to reduce the cost, size, and weight of antennas. In general, antenna gain is a function of its size measured in wavelengths, so that, at a given frequency, antenna gain decreases as antenna size decreases. A corollary is that antenna the gain of a physically small antenna may be increased by increasing the operating frequency. In an array antenna, the inter-element spacing decreases as the operating frequency increases. In general, the effective range of a radar or communication system depends upon how much power can be transmitted toward the target or receiver, since the designers of radar and communications systems attempt to use the best transistors or other signal amplifiers, namely those capable of transmitting the highest power, and for reception, those providing the lowest noise.

In an array antenna associated with a ground plane, the interelement spacing of the radiating elements defines the area behind the ground plane which can be devoted to electronics associated with a particular antenna element. The drive toward smaller antennas tends to result in higher frequencies, at which electronic equipment tends to be less efficient that at lower frequencies. Thus, array antennas for modern systems tend to operate at high frequencies and high power, with small antenna inter-element spacing. This, in turn, means a tendency toward higher power dissipation in the associated equipment. U.S. Pat. No. 5,013,997, issued May 7, 1991 in the name of Reese, describes a phase shifter for an array antenna in which a ferrite phase shifter coupled directly to the horn antenna element is immersed in liquid, and the hot liquid is made available to the radome for deicing. Other systems, such as that described in U.S. Pat. No. 5,017,927, issued May 21, 1991 in the name of Agrawal et al., make use of transmit-receive (TR) modules using one module associated with each antenna element. These TR modules include phase shifters, power amplifiers, low-noise amplifiers, and various types of filtering. In such an arrangement, the high frequency operation and high power results in large heat generation by transmitting transistors associated with each antenna element TR module, coupled with relatively small spacing between adjacent ones of the modules.

The performance of transistors and solid-state devices is closely linked to the operating temperature, and the reliability of such transistors and solid-state devices is linked to the long-term or historic operating temperature. Both of these considerations require keeping operating temperatures as low as possible. In the context of the high packing densities of array antennas, maintaining a low temperature of at least some portions of a transmitter is a significant problem.

Various options present themselves, such as reducing the heat generated so that conventional thermal conduction suffices. However, this tends to reduce the electromagnetic signal power available for transmission. If the amount of heat is given as a constant, other techniques can be used, such as cooling air flow in conjunction with finned heat sinks for the transistors or other solid-state devices, thermal management materials having extremely low thermal impedance, heat pipes, and liquid-filled cold plates. The problem of temperature control is much exacerbated by the need to make all the antenna element modules identical to reduce the manufacturing cost, and the need for such modules to be field-interchangeable. In the context of computer microprocessors, the drivers are the need for increased numbers of logic elements within confines which maintain short signal path lengths for high-speed operation.

U.S. Pat. No. 5,999,407, issued Dec. 7, 1999 in the name of Meschter et al. describes a scheme for conductively heat-sinking a heat-generating device mounted on a printed-circuit board through a thermally conductive structure to a module mounting rail, and thence to an ultimate heat sink. U.S. Pat. No. 5,552,633, issued Sep. 3, 1996 in the name of Sharma, describes the transfer of heat in a multilayer interconnect structure by way of thermally conductive posts extending through the multilayer structure. U.S. Pat. No. 5,459,474 issued Oct. 17, 1995 in the name of Mattioli et al. describes an active array antenna in which the antenna element modules, together with portions of the elemental antennas themselves, are mounted in side-by-side racks which slide from their operating position for maintenance.

Improved solid-state device cooling is desired for removable modules in closely spaced arrays and for chips having a high elemental packing density.

SUMMARY OF THE INVENTION

In the most general terms, a cooling arrangement according to various aspects of the invention is useful for semiconductors or solid-state assemblages which mount the semiconductor or other solid-state device directly onto a first surface of a thermally conductive "heat spreader." The heat spreader contains microchannels which open into coolant fluid ports on the second side of the heat spreader. The heat spreader, in turn, is mounted on a coolant fluid distribution or circulation plate. In one embodiment, the coolant fluid distribution plate also includes a micropump for circulating coolant fluid through the microchannels of the heat spreader. In another embodiment, the coolant fluid distribution plate simply distributes coolant applied to its fluid input port to those heat spreaders mounted thereon, and a plurality of coolant fluid distribution plates are mounted on a coolant fluid circulation plate, which uses a micropump to circulate coolant fluid to the various distribution plates and ultimately to the heat spreaders. Thus, coolant fluid is communicated directly into the support for the semiconductor chip or other solid-state device, for good heat transfer with low temperature drop.

In another general aspect of the invention, a solid-state device, such as, for example, a transistor, a laser, phase shifter or the like, is mounted on a supporting thermally conductive piece. The piece on which the solid-state device is mounted contains microchannels through which a flow of coolant fluid is established. The coolant flow originates, in a preferred embodiment of the invention, with a "cold" plate to which the thermally conductive piece is mounted, and in which a micropump causes coolant fluid to circulate.

More particularly, a monolithic solid-state chip includes a planar dielectric substrate defining first and second broad surfaces. For purposes of this invention, the planar dielectric substrate may include a semiconductor substrate which is not doped, or doped so as to be relatively nonconductive. The solid-state chip also defines electrical conductors lying on the first surface. The solid state chip produces heat during operation. According to an aspect of the invention, a thermally conductive plate including a first broad surface is directly connected to the second surface of the solid-state chip. The thermally conductive plate also includes a second broad surface substantially parallel with the first broad surface, at least sufficiently for mounting convenience. The thermally conductive plate includes at least one microchannel extending between coolant fluid input and output ports and between the first and second broad surfaces of the thermally conductive plate. The microchannel has a cross-sectional area smaller than about 0.001 square inch. In a preferred embodiment, the coolant fluid input and output ports are located on the second broad surface of the thermally conductive plate, and the microchannel is branched or formed into a finned structure at locations under the planar dielectric substrate, to increase the rate of heat exchange. A source of pressurized coolant fluid is coupled to the input port of the thermally conductive plate. In a particular version, the source of pressurized fluid coolant includes a micropump. One version of the micropump is operated by electric fields rather than magnetic fields. In another version, the micropump has a thickness less than about $2/10$ inch.

Another avatar of the invention lies in an array of electronic devices. The array comprises (a) a first monolithic solid-state chip including a planar dielectric substrate defining first and second broad surfaces, and also defining electrical conductors lying on the first surface. The first monolithic solid state chip producing heat during operation. The array also comprises (b) a first thermally conductive plate including a first broad surface directly connected to the second surface of the first solid-state chip. The first thermally conductive plate also includes a second broad surface substantially parallel with the first broad surface. The first thermally conductive plate includes at least one microchannel extending between coolant fluid input and output ports lying on the second broad surface of the first thermally conductive plate and between the first and second broad surfaces of the first thermally conductive plate. The microchannel has a cross-sectional area smaller than about 0.001 square inch. The array further comprises (c) a second monolithic solid-state chip including a planar dielectric substrate defining first and second broad surfaces, and also defining electrical conductors lying on the first surface. The second monolithic solid state chip produces heat during operation. The array further includes (d) a second thermally conductive plate including a first broad surface directly connected to the second surface of the second solid-state chip, and also including a second broad surface substantially parallel with the first broad surface. The second thermally conductive plate includes at least one microchannel extending between coolant fluid input and output ports lying on the second broad surface of the first thermally conductive plate and between the first and second broad surfaces of the second thermally conductive plate. The microchannel has a cross-sectional area smaller than about 0.001. (e) A third planar structure is provided. The third planar structure includes a broad first surface defining at least first, second, third and fourth fluid ports, the first and second fluid ports being registered with and immediately coupled to the fluid input and output ports of the first thermally conductive plate, and the third and fourth fluid ports being registered with and immediately coupled to the fluid input and output ports of the second thermally conductive plate, so that the second planar surfaces of the first and second thermally conductive plates. The third planar structure further defines a closed fluid path extending among the first, second, third and fourth fluid ports. The third planar structure further includes a micropump contained between the first and second broad surfaces of the third planar structure and coupled to the closed fluid path, for, when in operation, circulating coolant fluid through the closed fluid path to the coolant fluid input ports of the first and second thermally conductive plates, and from the coolant fluid output ports of the first and second thermally conductive plates.

According to another manifestation or aspect of the invention, an array of electronic devices includes a first and a second module, first and second intermediate fluid distribution plates, and a common fluid circulating plate. The first module comprises (a) a first monolithic solid-state chip including a planar dielectric substrate defining first and second broad surfaces, and also defining electrical conductors lying on the first surface. The first solid state chip produces heat during operation. The first module also includes (b) a first thermally conductive plate including a first broad surface directly connected to the second surface of the first solid-state chip, and also includes a second broad surface substantially parallel with the first broad surface. The first thermally conductive plate includes at least one microchannel extending between coolant fluid input and output ports lying on the second broad surface of the first thermally conductive plate and extends between the first and second broad surfaces of the thermally conductive plate. The microchannel has a cross-sectional area smaller than about 0.001 square inch, but may branch into plural parallel microchannels for enhancing heat transfer. The first module further includes (c) a second monolithic solid-state chip including a planar dielectric substrate defining first and second broad surfaces, and also defining electrical conductors lying on the first surface. This second solid state chip also produces heat during operation. The first module includes (d) a second thermally conductive plate including a first broad surface directly connected to the second surface of the second solid-state chip, and also including a second broad surface substantially parallel with the first broad surface. The second thermally conductive plate includes at least one microchannel extending between coolant fluid input and output ports lying on the second broad surface of the first thermally conductive plate and between the first and second broad surfaces of the second thermally conductive plate. The microchannel has a cross-sectional area smaller than about 0.001 square inch. The second module comprises (a) a first monolithic solid-state chip including a planar dielectric substrate defining first and second broad surfaces, and also defining electrical conductors lying on the first surface. The first solid state chip of the second module produces heat during operation. The second module includes (b) a first thermally conductive plate including a first broad surface directly connected to the second surface of the first solid-state chip, and also including a second broad surface substantially parallel with the first broad surface. The first thermally conductive plate includes at least one microchannel extending between coolant fluid input and output ports lying on the second broad surface of the first thermally conductive plate and between the first and second broad surfaces of the thermally conductive plate; the microchannel has a cross-sectional area smaller than about 0.001 square inch. The second module also includes (c) a second monolithic solid-state chip including a planar dielectric substrate defining first and second broad surfaces, and also defining electrical conductors lying on the first surface. As with the other solid-state chips, the second solid state chip of the second module produces heat during operation. The second module further includes (d) a second thermally conductive plate including a first broad surface directly connected to the second surface of the second solid-state chip, and also including a second broad surface substantially parallel with the first broad surface. The second thermally conductive plate of the second module includes at least one microchannel extending between coolant fluid input and output ports lying on the second broad surface of the first thermally conductive plate of the second module and between the first and second broad surfaces of the thermally conductive plate. As with the other microchannels, the cross-sectional area is smaller than about 0.001 square inch. The array of electronic devices also includes a first intermediate fluid distribution plate associated with the first module. The first intermediate fluid distribution plate defines a first broad side and a second broad side. The first intermediate fluid distribution plate includes at least one fluid input port and at least one fluid output port defined on the second broad side, and at least first, second, third and fourth fluid ports on the first broad side. The first and second fluid ports of the first intermediate fluid distribution plate of the array of electronic devices are registered with the fluid coolant input and output ports of the first thermally conductive plate of the first module, and the third and fourth fluid ports of the first intermediate fluid distribution plate are registered with the fluid coolant input and output ports of the second thermally conductive plate of the first module. The first intermediate fluid distribution plate distributes fluid entering the fluid input port of the first intermediate fluid distribution plate to the fluid coolant input ports of the first and second thermally conductive plates of the first module. The second intermediate fluid distribution plate is associated with the second module. The second intermediate fluid distribution plate is similar to the first, and defines a first broad side and a second broad side. The second intermediate fluid distribution plate includes at least one fluid input port and at least one fluid output port defined on the second broad side, and also defines at least first, second, third and fourth fluid ports on the first broad side thereof. The first and second fluid ports of the second intermediate fluid distribution plate are registered with the fluid coolant input and output ports of the first thermally conductive plate of the second module, and the third and fourth fluid ports of the second intermediate fluid distribution plate are registered with the fluid coolant input and output ports of the second thermally conductive plate of the second module, for distributing fluid entering the fluid input port of the second intermediate fluid distribution plate to the fluid coolant input ports of the first and second thermally conductive plates of the second module. Finally, the array of electronic devices includes a common planar fluid circulating plate. The common planar fluid circulating plate defines first and second broad surfaces. The first broad surface of the common planar fluid circulating plate defines at least first, second, third and fourth fluid ports. The first and second fluid ports of the common planar fluid circulating plate are registered with the fluid input and fluid output ports defined in the second broad side of the first intermediate fluid distribution plate, and the third and fourth fluid ports of the common planar fluid circulating plate are registered with the fluid input and output ports defined in the second broad side of the second intermediate fluid distribution plate. The common planar fluid circulating plate further comprises at least one fluid channel coupled to the first, second, third, and fourth fluid ports defined in the first side, and a micropump lying between the first and second broad sides of the common planar fluid circulating plate, for circulating fluid through the at least one fluid channel. A mounting arrangement or means is coupled to the first and second thermally conductive plates of the first and second modules, to the first and second intermediate fluid distribution plates, and to the common planar fluid circulation plate, for physically connecting the first and second thermally conductive plates of the first and second modules, the first and second intermediate fluid distribution plates, and the common planar fluid circulation plate together, so that the microchannels of the first and second thermally conductive plates of the first module, the microchannels of the first and second thermally conductive plates of the second module, the ports of the first and second intermediate fluid distribution plates, and the at least one fluid channel of the common planar fluid circulation plate form a closed fluid path through which coolant fluid is recirculated by the micropump. Ideally, the second broad surfaces of the first and second conductive plates of the first and second modules are juxtaposed with the first broad surfaces of their respective intermediate fluid distribution plates, and the second surfaces of the intermediate fluid distribution plates are juxtaposed with the first broad surface of the common planar fluid circulating plate.

BRIEF DESCRIPTION OF THE DRAWING

FIG. 2a is a simplified perspective or isometric view of a plurality of solid-state chips and thermally conductive mounting plates as in FIGS. 1a and 1b, mounted onto a coolant fluid distributing plate, FIG. 2b is an exploded view of the structure of FIG. 2a to illustrate fluid ports, FIG. 2c is simplified perspective or isometric view of the underside of the coolant fluid distribution plate.

FIGS. 3a, 3b, and 3c are simplified perspective or isometric views, partially exploded in the case of FIGS. 3a and 3b, of an intermediate coolant fluid distribution plate which may be used to explain the principles of with one aspect of the invention;

DESCRIPTION OF THE INVENTION

Figure 1A:
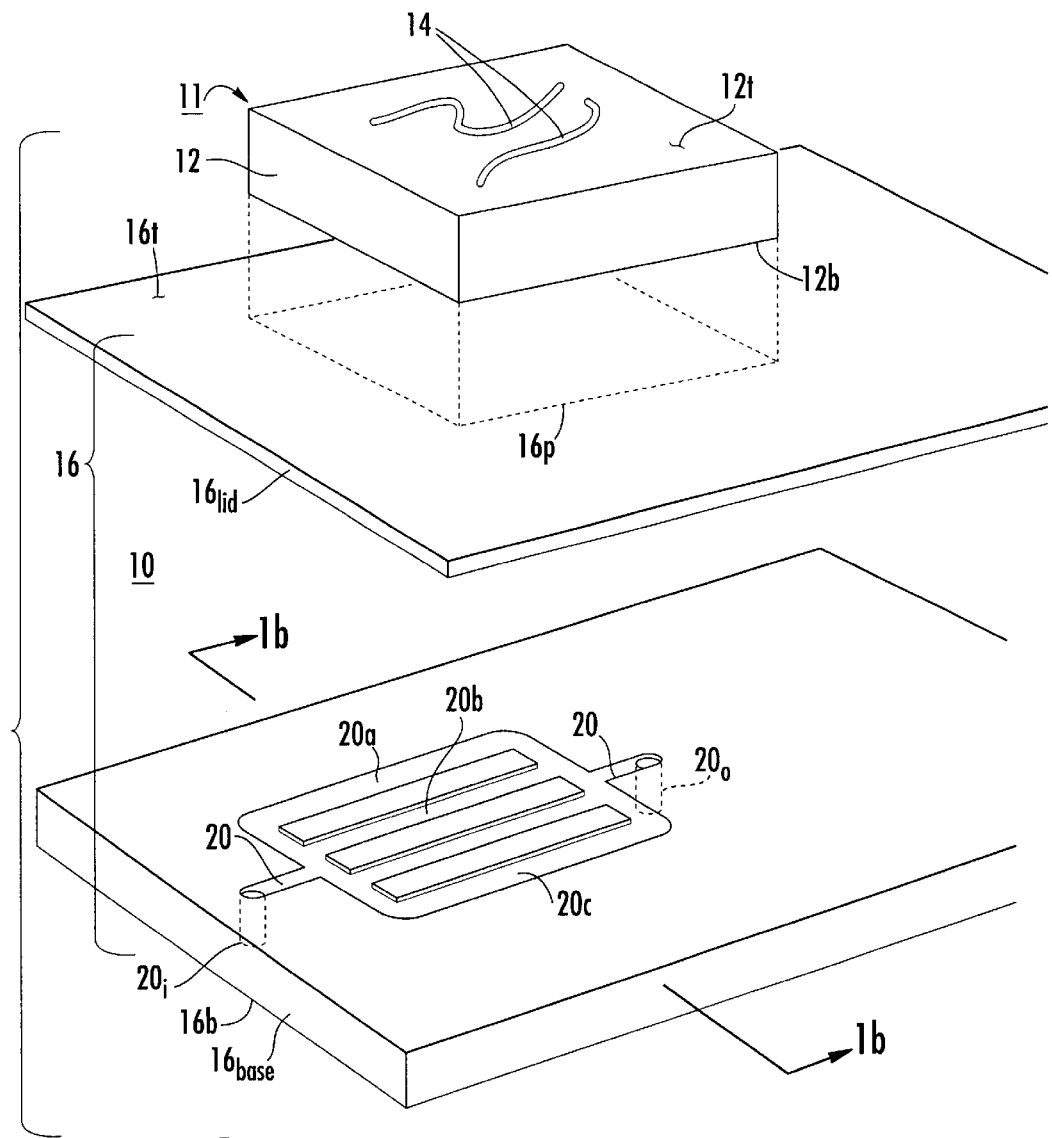
FIG. 1a is a simplified exploded perspective or isometric view of a solid-state chip and a thermally conductive mounting plate to illustrate the principle according to a thermal control aspect of the invention.
Figure 1B:
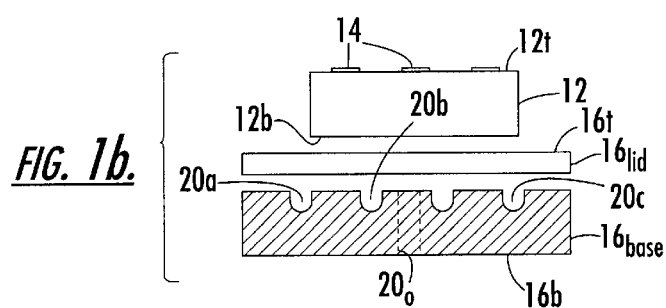
FIG. 1b is a cross-section thereof taken along section lines b—b.
Figure 1C:
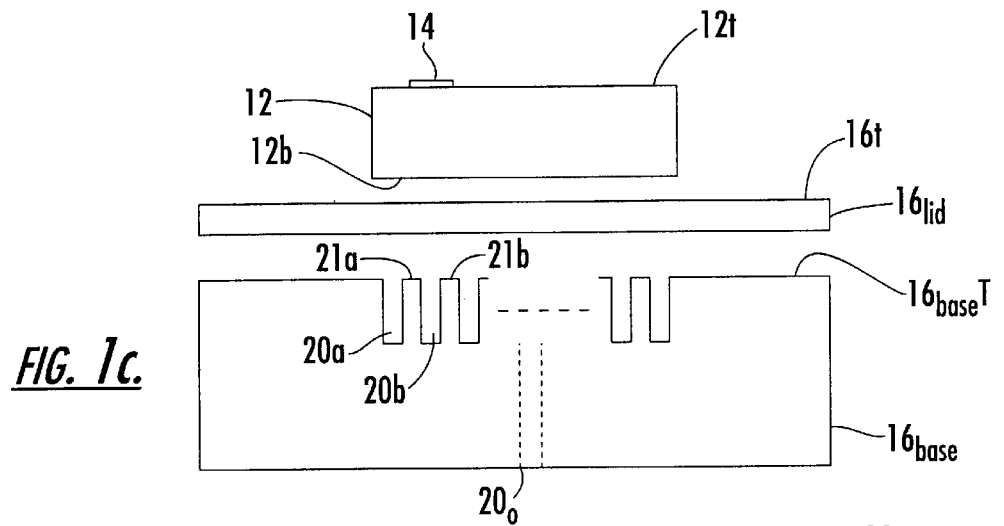
FIG. 1c is similar to FIG. 1b, but has a fins instead of walls.
Figure 1D:
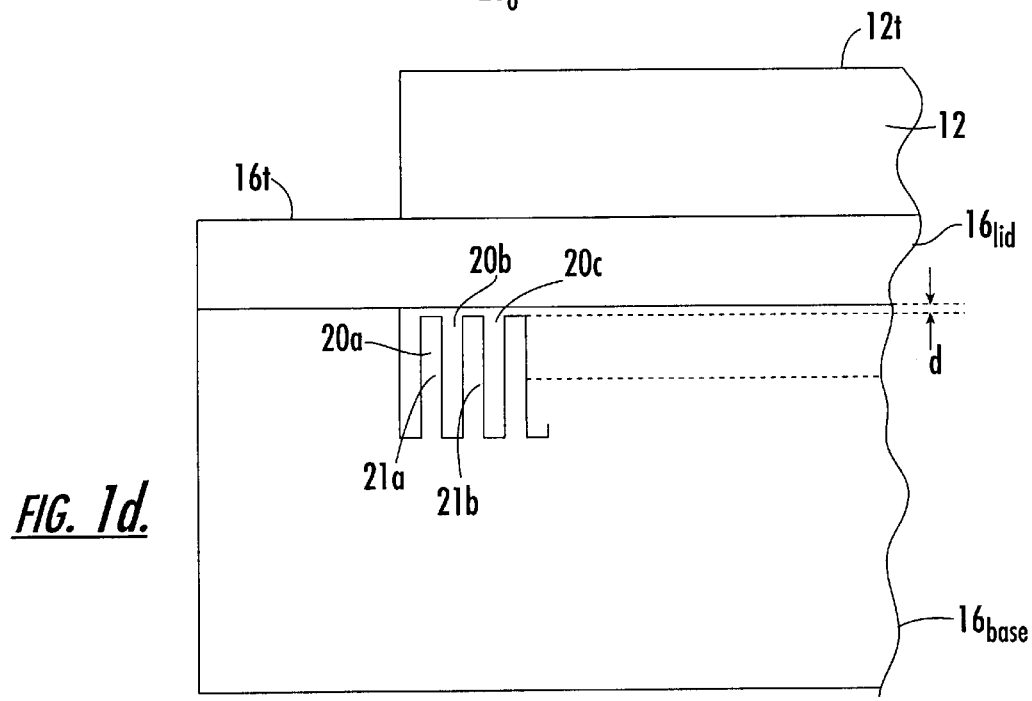
FIG. 1d is similar to FIG. 1c, but has fins which do not extend to the lid.
Figure 1E:
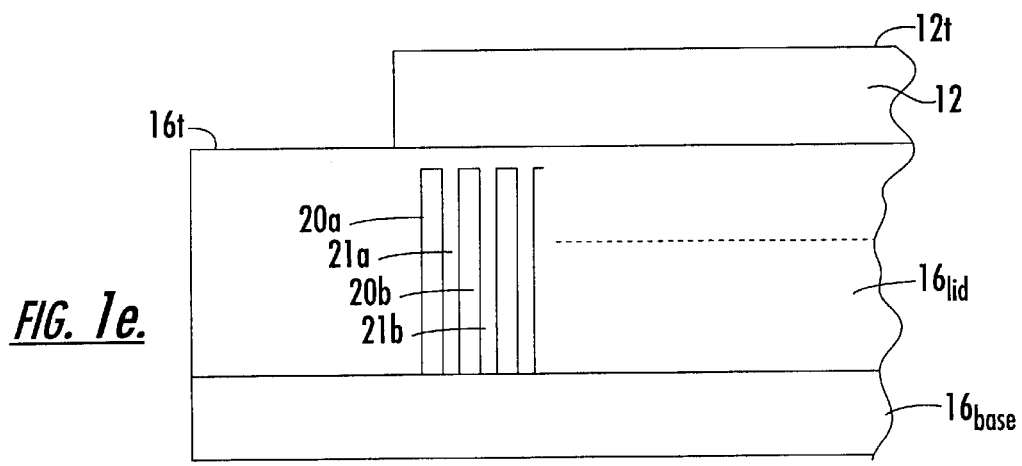
FIG. 1e is similar to FIG. 1d, but has the fins formed as part of the lid rather than the base.

In FIGS. 1a and 1b, a structure 10 includes a solid-state chip 11 defining a body 12 having a planar top surface 12t and a bottom surface 12b, where "top" and "bottom" are defined with reference to the FIGURE. The top surface 12t of body 12 bears electrical conductor patterns illustrated as 14, which are intended to represent the conductor patterns required for a semiconductor device or devices if body 12 is a semiconductor, or the corresponding patterns for other solid-state devices which may be made on a planar dielectric substrate. In general, the electrical conductivity of body 12 will be low, either because it is mainly of a dielectric material, or because it is made from undoped or lightly doped semiconductor material. In the case of semiconductor material, the body 12 will include highly doped regions near the upper surface 12$t$, to which some of the conductors 14 may connect. In operation, with sources of electric power coupled to some of the conductors 14, solid-state chip 11 produces heat, as known to those skilled in the art.

According to an aspect of the invention, solid-state device 11 of FIGS. 1$a$ and 1$b$ is mounted to a location defined by dotted projection lines 16$p$ on upper surface 16$t$ of thermally conductive plate 16. The connection is preferably highly thermally conductive, so that heat can be extracted from chip 11 with the lowest possible temperature difference or thermal drop. One suitable means for making a connection is by way of a low-temperature metallurgic junction such as low-temperature solder or filled epoxy.

As illustrated, thermally conductive plate 16 of FIGS. 1$a$ and 1$b$ is made up of a lid 16$_{lid}$ and base, body or plate 16$_{base}$. In FIGS. 1$a$ and 1$b$, base 16$_{base}$ has a planar upper surface 16$_{baseT}$, on which a plurality of microchannels are cut, incised, etched, laser-ablated, molded, or otherwise formed. A first microchannel formed in surface 16$_{baseT}$ is designated as 20. As illustrated, these microchannels may be open, but when lid 16$_{lid}$ is fastened onto the base, the microchannels become closed, in the sense that fluid contained therein cannot exit by way of the seam at the juncture (not designated) of the lid 16$_{lid}$ and the base 16$_{base}$. The channel 20 "originates" at a fluid input port 20$i$ opening onto lower or bottom surface 16$b$ of thermally conductive plate 16, and extends, by way of a plurality of branches 20$a$, 20$b$, 20$c$ . . . and a further portion of channel 20 to a fluid exit or output port 20$o$, also opening onto the lower surface 16$b$. In operation, coolant fluid under pressure is applied to input port 20$i$, and flows through the channels 20, 20$a$, 20$b$, . . . and ultimately to fluid outlet port 20$o$. As illustrated in FIG. 1A, the branched portion 20$a$, 20$b$, 20$c$, . . . of the fluid microchannels lies under the region defined by projection lines 16$p$ on the top surface of lid 16$_{lid}$, so that the amount of circulating coolant fluid is maximized under the heat-generating solid-state chip 11. According to an aspect of the invention, each of the microchannels extending through thermally conductive plate 16 has a cross-sectional area of less than about 0.001 square inch. The source (not illustrated in FIGS. 1$a$ and 1$b$) of coolant fluid under pressure may include a micropump.

FIG. 1$c$ is a simplified cross-section similar to that of FIG. 1$b$, but in which the separation between the individual microchannels 20$a$, 20$b$, 20$c$, . . . is reduced to such an extent that the structure is similar to a finned heat exchanger. In FIG. 1$c$, elements corresponding to those of FIGS. 1$a$ and 1$b$ are designated by like reference numerals. As illustrated therein, the various microchannels 20$a$, 20$b$ . . . are separated by walls 21$a$, 21$b$, . . . which have a thickness on the same order as that of the microchannels themselves, which is to say from about $\frac{1}{10}$ to 10 times the width of the associated channels. FIG. 1$d$ is similar, but shows that the fins 21$a$, 21$b$ need not extend all the way flush with the lower surface of the lid portion 16$_{lid}$, but rather there may be a gap having dimension "d." This dimension should be small, but serves two purposes. The first purpose is to prevent an interference fit between the upper ends of the fins 21$a$, 21$b$, . . . which might prevent the lid 16$_{lid}$ from firmly seating against the upper surface of the base portion 16$_{base}$. The second purpose is to allow a slight flow of coolant fluid against the lid portion, which is the source of the heat, even in regions between the fins. FIG. 1$e$ illustrates an arrangement in which the fins are formed in the lid portion 16$_{lid}$ rather than in the base portion 16$_{base}$.

In FIGS. 2$a$, 2$b$, 2$c$, and 2$d$, a plurality of electronic devices, namely devices 11 and 11$a$, and possibly others not illustrated, are mounted on the top surface of a coolant fluid distribution plate 210 to form an array 200. Each of the devices 11, 11$_2$, . . . is similar to that illustrated and described in conjunction with FIGS. 1$a$ and 1$b$. A parting line 210$p$ extending around coolant fluid distribution plate 210 indicates where a separate upper plate 210$u$ and lower plate 210$l$ are joined, for purposes described below. FIG. 2$b$ illustrates the electronic devices 11, 11$_2$, . . . exploded away from the top (relative to the FIGURE) surface 12$t$, to show the fluid input ports 20$i$ of the electronic devices 11, 11$_2$, and how they are registered with fluid output ports 201, 203, and fluid input ports 202, 204 on the top surface 201$t$. When the bottom surfaces 16$b$ of electronic devices 11, 11$_2$ are juxtaposed with top surface 210$t$ of coolant fluid distribution plate 210, the various ports align. While not illustrated herein, various means may be used to aid in sealing such connections. In one embodiment of the invention, conventional O-rings associated with annular depressions are associated with each port pair, in known fashion. The annular depressions allow the bottom surfaces 16$b$ to align flush with top surface 210$t$ notwithstanding the presence of the O-ring(s). FIG. 2$c$ illustrates the bottom surface 210$b$ of coolant fluid distribution plate 210. The only features to be seen in this view are two electrical connections 250$a$, 250$b$ which are sealed, as for example with a glass frit, to prevent ingress or egress of moisture.

FIG. 2$d$ illustrates the upper portion 210$u$ of plate 210 exploded away from lower portion 210L, revealing interior details. Lower plate 210L has an elongated channel 220 cut (by any means, including etching and ablation) into its upper surface 210L$t$. As illustrated, channel 220 extends from a first end 220E$_1$ over a portion of the length of the coolant fluid distribution plate 210 to a turnaround location 220T, from which it returns to a second end 210E$_2$. At various locations along the length of channel 210 on upper surface 210L$t$ of the lower portion 210L, branch channels 220$_1$, 220$_2$, 220$_3$, and 220$_4$ extend inwardly toward the center of the plate. The locations of the branch channels 220$_3$, 220$_2$, 220$_3$, and 220$_4$ are selected so that the branch ends are registered with the fluid ports 201, 202, 203, and 204, respectively, which extend through plate portion 210$u$. This registry guarantees that fluid flowing in the channel 210 can enter or exit, as appropriate, through the fluid ports 201, 202, 203, and 204. The fluid channel 220 of FIG. 2$d$ also exhibits an enlarged portion 230L, which has a corresponding depression or clearance cavity 232 registered therewith and formed in upper portion 210$u$. Cavity 232 does not extend all the way through to top surface 210$t$ of plate 210. Cavity 232 and enlarged portion 230 of channel 220 together provide clearance for a micropump illustrated as a block 240. Micropumps are well known, and are of many types. A micropump may be as simple as a conventional fluid pump with electric motor miniaturized to the desired level. However, the most reliable such devices are made by semiconductor-type processing on silicon and other substrates. A salient feature of such pumps is that they generally operate on electric fields rather than on magnetic fields as do conventional motors. Micropump 240 has a volume which fits within the confines (between the top surface 210$t$ and the bottom surface 210$b$) of the plate 210. Micropump 240 has a pair of electrical connections illustrated as protruding elements 241 and 242 which are registered with corresponding apertures 231 and 232 in enlarged portion 230. When micropump 240 is mounted between the two halves 210u, 210L of plate 210, the electrical connections 241, 242 extend into, and possibly protrude through, apertures 231 and 232, respectively, to provide access for energizing the pump. These electrical connections may be made and sealed in any of a number of known ways. It should be noted that fluid channels 220 in coolant fluid distribution plate 210 carry the fluid from a plurality of electric devices 11, $11_2$, . . . , and thus may have dimensions larger than 0.001 square inches.

The arrangement of FIGS. 2a, 2b, 2c, and 2d may be used where the array of electronic devices produces heat, and it is desired to convey the heat to plate 210 for further transfer. For example, plate 210, together with its electronic devices 11, could be edge-mounted to a cold frame as known in the art, to thereby transfer heat away from the thermally conductive plate 210. A plate 210 as described in conjunction with FIGS. 2a, 2b, 2c, and 2d could be used to thermally sink the main heat-producing devices of, for example, a transmit-receive (TR) module. Similarly, a plate similar to that of FIG. 2d could be used to sink the heat from a microprocessor and other chips of a computer. There is no reason that electronic devices 11 of differing sizes could not be mounted on a plate such as 210, but they are illustrated as being of the same size for ease of illustration.

Figure 2D:
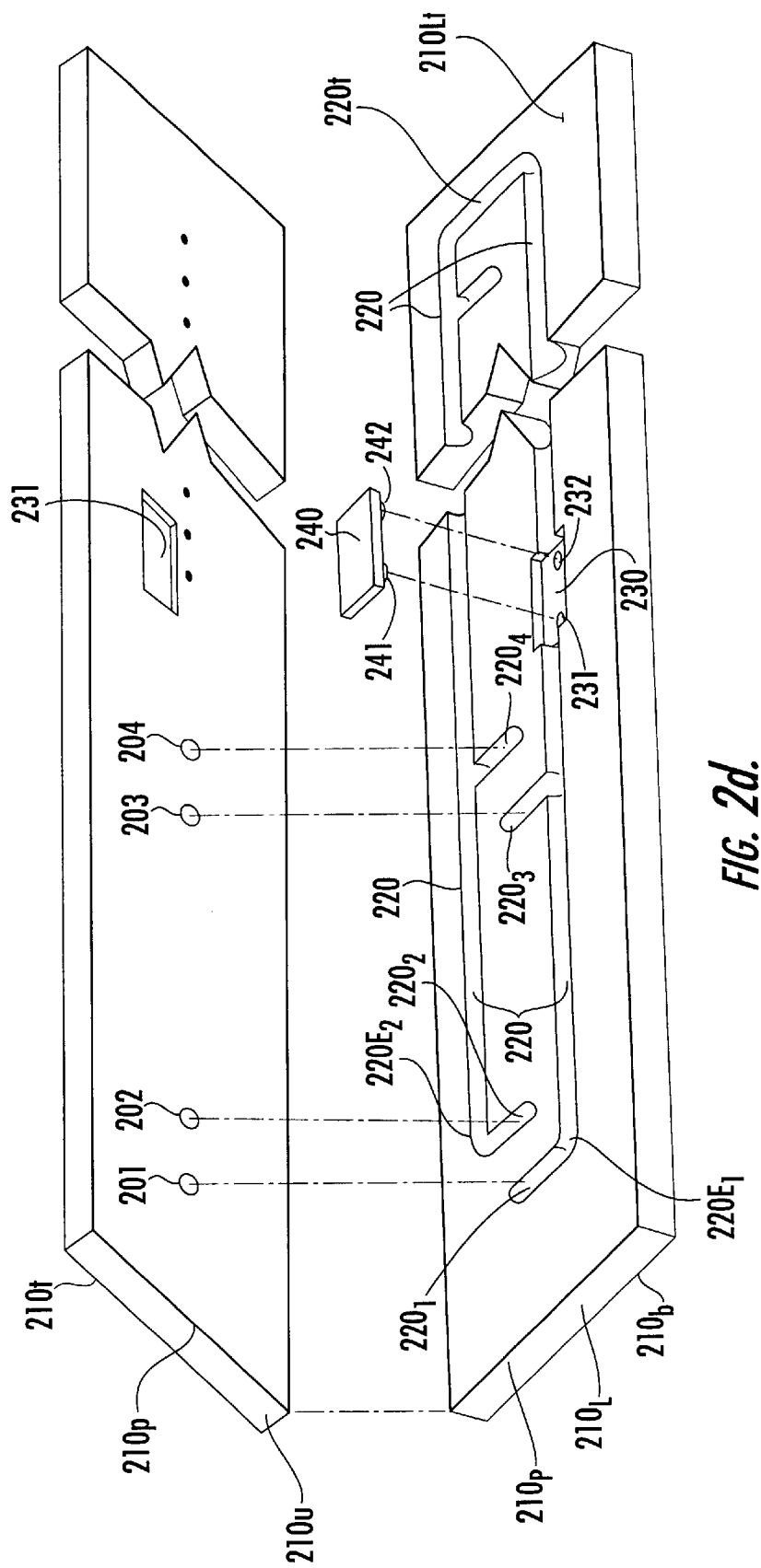
FIG. 2d is a simplified perspective or isometric view of constituent parts of the coolant fluid distribution plate, illustrating its internal channels and pump.

FIG. 3a is similar to FIG. 2d, but differs in one important respect. In FIG. 3a, the coolant fluid distribution plate 310 does not include a pump, as does plate 210 of FIG. 2d. Instead, circulation of coolant fluid through channel 220, and through the microchannels 20, 20a, 20b, . . . of the thermally conductive plates 12 of the various electronic devices 11 which may be coupled to coolant fluid distribution plate 310, is effected by a pair of fluid ports extending from the two ends 220E1 and 220E2 of the fluid channel 220 through to the bottom surface 210b of coolant fluid distribution plate 310, together with an external source (not illustrated in FIG. 3a or 3b) of coolant fluid under pressure (or vacuum, if appropriate). The fluid input port is designated as 320i in FIG. 3b, and the fluid output port is designated 320o. FIG. 3c illustrates fluid ports 201, 202, 203, and 204 associated with the top surface 210t of plate 310.

Figure 4:
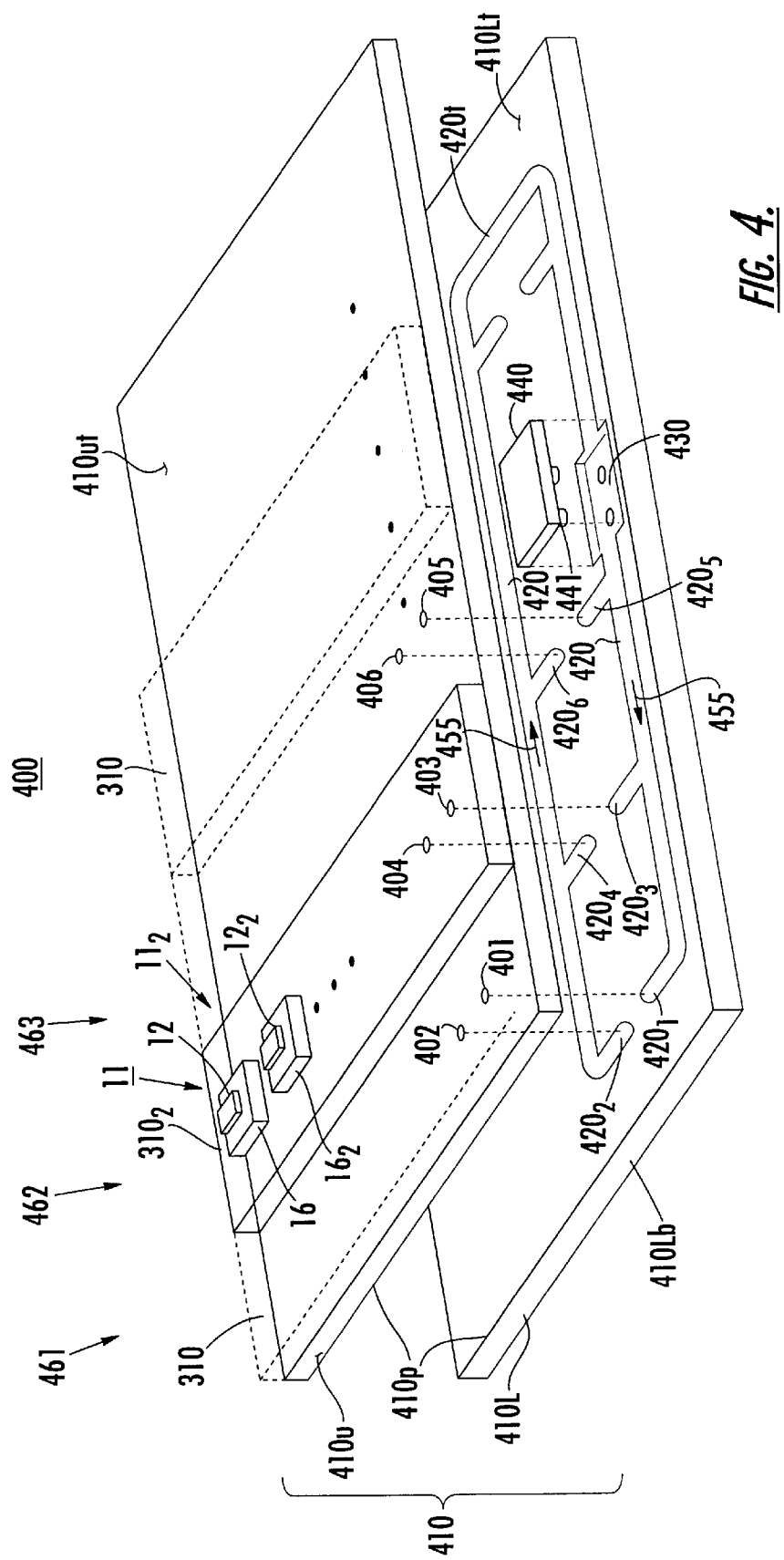
FIG. 4 is a simplified perspective or isometric exploded view of an assemblage to explain the principles of another aspect of the invention.

FIG. 4 is a simplified exploded illustration in perspective or isometric view illustrating details of another embodiment of the invention. In FIG. 4, a plurality of coolant fluid distribution plates 310 similar to that illustrated in FIGS. 3a and 3b have electronic devices 11, $11_2$ . . . mounted thereon. The various coolant fluid distribution plates 310 are mounted on a common planar fluid circulating plate 410. As illustrated in FIG. 4, common planar fluid circulating plate 410 is exploded along a parting line 410p to show an upper portion 410u and a lower portion 410L. The upper portion 410u of common planar fluid circulation plate 410 has a plurality of sets of fluid apertures 401, 402, 403, 404, 405, 406, . . . which are registered, in pairs, with the fluid input and output ports $320_1$ and $320_2$ of the coolant fluid distribution plates 310 which may be mounted thereon. Thus, port 401 on the upper surface 410ut of common planar fluid circulating plate 410 is registered with a port $320_1$ of one of the coolant fluid distribution plates 310 mounted on plate 410, port 403 on the upper surface 410ut of common planar fluid circulating plate 410 is registered with a similar port $320_1$ of another one of the coolant fluid distribution plates 310 mounted on plate 410, and so forth. Similarly, port 402 on the upper surface 410ut of common planar fluid circulating plate 410 is registered with a port $320_2$ of one of the coolant fluid distribution plates 310 mounted on plate 410, and port 404 on the upper surface 410ut of common planar fluid circulating plate 410 is registered with a similar port $320_2$ of another one of the coolant fluid distribution plates 310 mounted on plate 410, and so forth. The spacing between port pairs $420_1$, $420_2$ and $420_3$, $420_4$ is selected to be no less than the spacing between the port pairs $320_1$, $320_2$ of two adjacent coolant fluid distribution plates 310 mounted on plate 410, so no interferences occur.

As generally described in conjunction with FIG. 2d, the upper surface 410Lt of the lower portion 410L of plate 410 of FIG. 4 has formed therein at least one elongated channel 420, which extends from one end $420_1$ along the length of plate 410 to a turn-around 420T, and returns to another end $420_2$. At locations corresponding to, or registered with, port pairs 401, 402; 403, 404; 405, 406, . . . extending through the upper portion 410u, branches of channel 420 extend inward to communicate therewith. A micropump 440 is mounted in an enlarged portion 430 of channel 420, in the same manner as described in conjunction with FIG. 2d, for causing coolant fluid circulation. Assuming that pump 440 causes fluid to flow in the direction represented by arrows 455, fluid flows from branch $420_1$ through aperture 401 and into a port $320_1$ of one of the coolant fluid distribution plates 310. As a result, coolant fluid must be expelled from port $320_2$ of the plate 310, which then flows through port 402 in upper portion 410u of common fluid circulating plate 410 and into a return portion of channel 420. Similarly, fluid flows into branch $420_3$, through port 403 in top portion 410u, and into a port corresponding to port $320_1$ of that one of the coolant fluid distribution plates 310 associated with port pair 403, 404. Perforce, coolant fluid flows from the output port $320_2$ of that plate 310, through port 404 on the upper surface 410ut, and into branch $420_4$ of a return portion of channel 420. Thus, a single micropump 440 is capable of providing coolant fluid flow for a plurality of coolant fluid distribution plates.

Figure 5A:
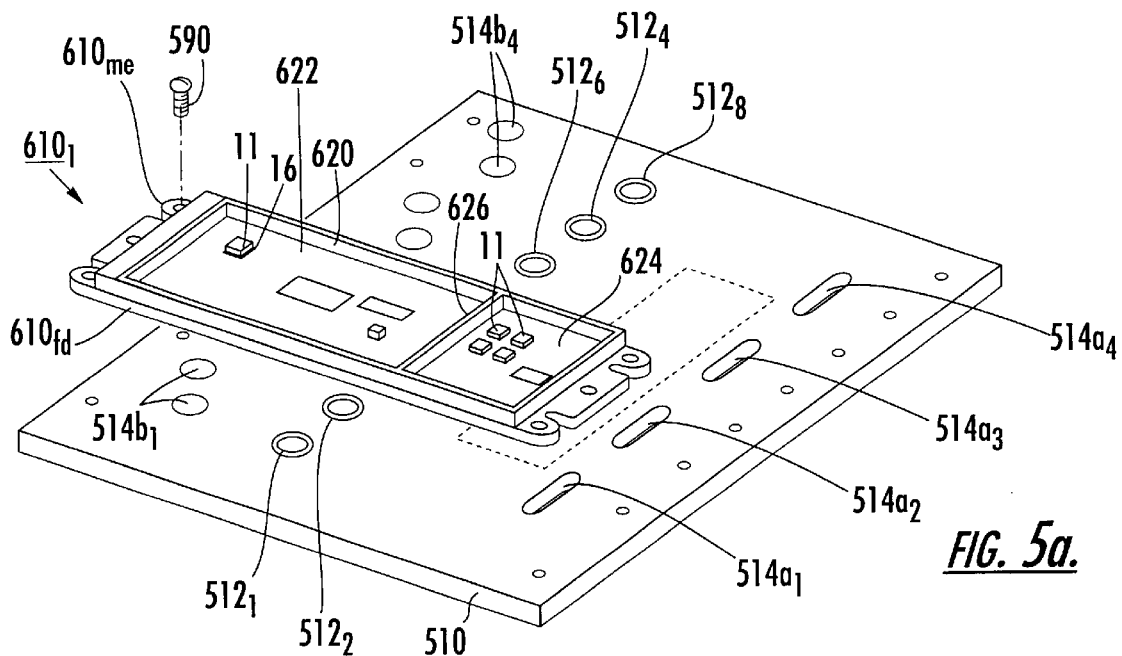
FIGS. 5a, 5b, 5c, 5d, and 5e are illustrations showing how some of the principles set forth in conjunction with FIGS. 1a, 1b, 1c, 1d, 2a, 2b, 2c, 2d, 3a, 3b, 3c, and 4 are applied to an actual transmit-receive module array.
Figure 5B:
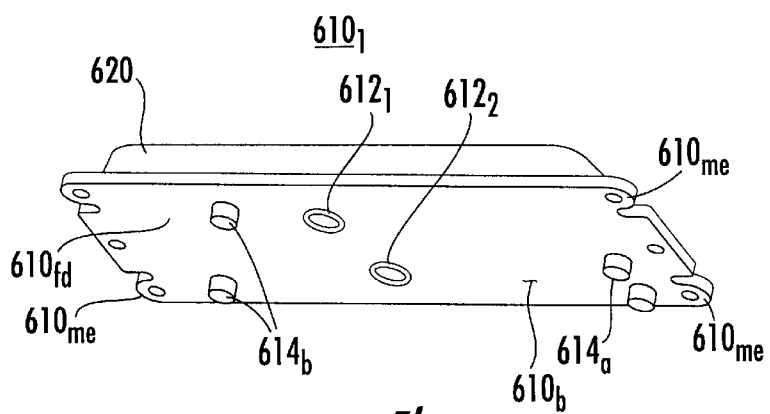

So far, only the thermal aspects of the arrangement according to the invention have been described. In a particular aspect of the invention, the electronic devices 11 associated with any one of the coolant fluid distribution plates 310 of FIG. 4 are the main heat-producing sources of a transmit-receive (TR) module of an array antenna. FIG. 5a represents a single TR module $610_1$ according to an aspect of the invention shown exploded away from a coolant fluid circulating plate 510 adapted to receive four TR modules such as module $610_1$, and also illustrated without its lid to reveal interior details. FIG. 5b illustrates the bottom of any one of the four TR modules which plate 510 of FIG. 5a can accommodate, and for definiteness illustrates the bottom of TR module $610_1$. As illustrated in FIGS. 5a and 5b, TR module $610_1$ has a coolant fluid distribution plate 610fd defining pierced mounting ears, one of which is designated 610me, and also defining slightly protruding coolant fluid input and output ports $612_1$ and $612_2$. The TR module $610_1$ of FIG. 5b also has four coaxial connectors, one pair of which is designated 614a, and the other pair of which is designated 614b, protruding below the bottom surface 610b. These coaxial connectors provide input and output electromagnetic signal or radio-frequency (RF) signal ports to a power amplifier and a low-noise amplifier associated with TR module $610_1$, as known in the art. The "upper" side of TR module $610_1$ includes a ceramic housing 620 which is metallized as may be required, and which divides the available space into first 622 and second portions 624 by a wall 626, as is best illustrated in FIG. 5a. Spaces 622 and 624 are occupied by the power amplifier (not designated)

and the low-noise amplifier (also not designated). Certain portions of the circuitry may be mounted on insulators on the upper surface of coolant fluid distribution plate 610*fd*, and the main heat-producing devices are mounted on thermally conductive plates as described in conjunction with FIGS. 1*a*, 1*b*, 1*c*, 1*d*, and 1*e*, and the thermally conductive plates are in turn mounted on the upper surface of fluid distribution plate 610*fd* as described in conjunction with FIGS. 2*a* and 2*b*. In FIG. 5*a*, three representative such items are designated as "11," but it will be understood that they include thermally conductive plates such as 16, each with its own microchannels. Not all the heat-producing devices of TR module 610$_1$ are so mounted, however, as the heat produced by those items may be small enough so that other cooling techniques suffice.

When TR module 610$_1$ of FIG. 5*b* is mounted on the coolant fluid circulation plate 510 of FIG. 5*a*, the slightly protruding fluid input and output apertures 612$_1$ and 612$_2$ are registered with, and sealingly engage, the corresponding fluid apertures 512$_1$ and 512$_2$ of the coolant fluid circulation plate 510, which are fitted with O-rings dimensioned to the protruding fluid ports. Also, when TR module 610$_1$ is mounted onto coolant fluid circulation plate 510, the pair of protruding coaxial ports 614*a* extend through an elongated oval or elliptical aperture 514*a*$_1$, and are accessible from the reverse side (not illustrated in FIG. 5*a*) of coolant fluid circulation plate 510. The pair of RF ports designated 614*b* in FIG. 5*b* protrudes through a corresponding aperture pair 514*b*$_1$. When so mounted, TR module 610$_1$ is held down to the coolant fluid circulation plate 510 by a set of screws, on of which is designated 590, which thread through the pierced mounting ears 610*me* into correspondingly threaded apertures in plate 510.

Figures 5C, 5D:
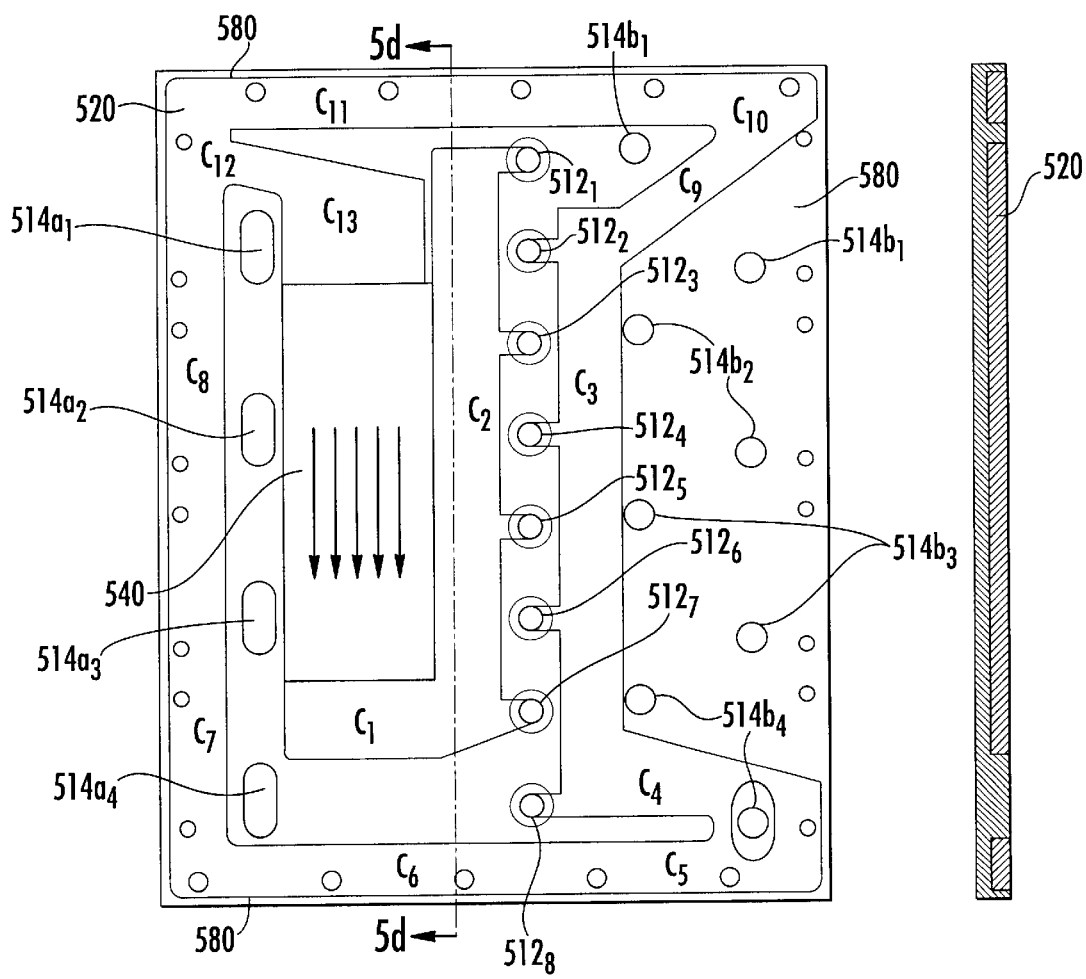

FIG. 5*c* is a top view of the base portion of coolant fluid distribution plate 510 without its planar lid, to reveal interior details of the fluid channels. In FIG. 5*c*, a raised peripheral wall 580 prevents coolant fluid from escaping laterally from a fluid channel 520. The fluid channel 520 is marked at various locations with the letter "C" together with a subscript, to indicate the existence of a channel at the location of the letter. The locations of elliptical apertures 514*a*1, 514*a*2, 514*a*3, and 514*a*4 are in a "ground" portion of the structure, which is the portion which, when the lid (not illustrated) is in place, results in a solid metal (or other material) through the thickness of the coolant fluid distribution plate 510, to prevent fluid flow in or through the ground region. Similarly, all of the apertures 514*b*1, 514*b*2, 514*b*3, and 514*b*4, which are provided for passage of electromagnetic signal connectors, are in ground regions, and therefore cannot leak fluids.

A micropump 540 is mounted within coolant fluid circulation plate 510 of FIG. 5*c* in a portion of channel 520 lying between locations C13 and C1, with the direction of fluid flow indicated by arrows to be from C13 to C1. Fluid flows through channel 520 from location C1 to an elongated location C2, and through fluid ports 512$_1$, 512$_3$, 512$_5$, and 512$_7$ to the individual TR modules, and the heated coolant fluid returns from fluid ports 512$_2$, 512$_4$, 512$_6$, and 512$_8$ to portion C3 of the channel 520. From portion C3, the fluid may flow back to the pump 540 by two paths, the first of which includes locations C4, C5, C6, C7, C8, C12, and C13, and the second of which includes locations C9, C10, C11, C12, and C13.

The term "micropump" is difficult to define precisely, but for purposes of this invention means that the pump is completely or almost completely enclosed with a heat distribution plate; another definition might be "having a thickness less than 0.2 inch" or "having a pumping capacity of less than 4 gallons per hour".

Another characteristic which can be used to define at least one class of micropumps is that the motors are energized by electric fields alone, and magnetic elements are not required therein.

Figure 5E:
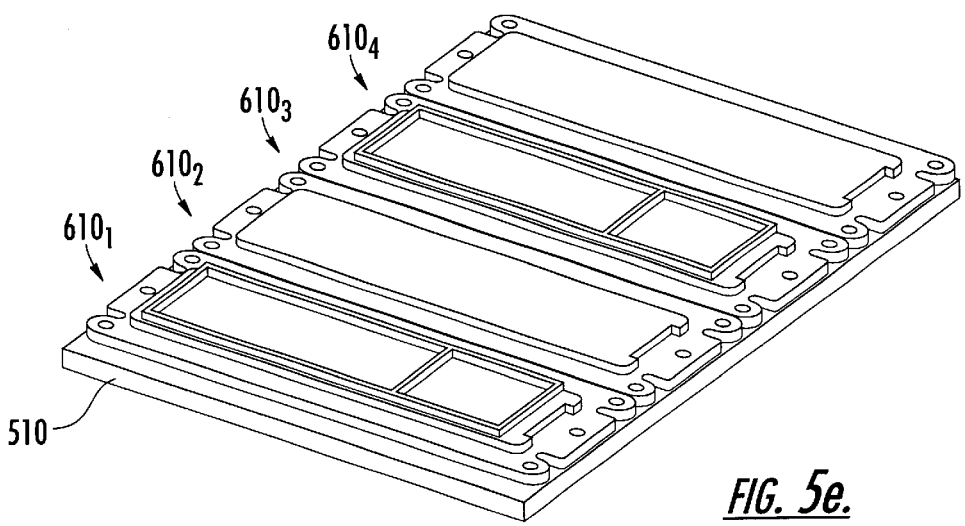

FIG. 5*d* illustrates the cross-sectional configuration of coolant fluid circulation plate 510 of FIG. 5*c* taken at section line d—d. FIG. 5*e* illustrates four TR modules 610$_1$, 610$_2$, 610$_3$, and 610$_4$, mounted on coolant fluid circulation plate 510. The plate 510, in turn, can be heat-sunk in any number of conventional manners, as by clamping to a cold frame.

Other embodiments of the invention will be apparent to those skilled in the art. For example, while the illustrations relate for the most part to the cooling of TR modules in the context of a high-packing-density array, the principles apply to single chips or a few chips of a high-density microprocessor, or any high-density semiconductor or solid-state arrangement.

Thus, according to an aspect of the invention, a monolithic solid-state chip (11) includes a planar dielectric substrate (12) defining first (12*t*) and second (12*b*) broad surfaces. For purposes of this (FIGS. 1*a*, 1*b*, 1*c*, 1*d*, 1*e*) invention, the planar dielectric substrate (12) may include a semiconductor substrate which is not doped, or which is doped so as to be relatively nonconductive. The planar dielectric substrate (12) may instead be a dielectric such as sapphire, on which transistor elements are deposited or grown. The solid-state chip (11) also defines electrical conductors (14) lying on the first surface (12*t*) as part of the active device(s) thereon. The solid state chip (11) produces heat during operation. According to an aspect of the invention, a thermally conductive plate (16) including a first broad surface (16*t*) is directly connected to the second surface (12*b*) of the body (12) of solid-state chip (11). The thermally conductive plate (16) also includes a second broad surface (16*b*) substantially parallel with the first broad surface (16*t*), at least sufficiently for mounting convenience. The thermally conductive plate (16) includes at least one microchannel (20) extending between coolant fluid input (20*i*) and output ports (20*o*) and between the first (16*t*) and second (16*b*) broad surfaces of the thermally conductive plate (16). Each microchannel (20, 20*a*, 20*b*, . . . ) has a cross-sectional area smaller than about 0.001 square inch. In a preferred embodiment, the coolant fluid input (20*i*) and output (20*o*) ports are located on the second broad surface (16*b*) of the thermally conductive plate (16), and the microchannel (20) is branched or formed into a finned structure at least at locations under the planar dielectric substrate (12), to increase the rate of heat exchange. In a particular embodiment of the thermally conductive plate (16), a lid (16$_{lid}$) is fastened, as by brazing, to a base (16$_{base}$), and the microchannels are formed on one of the surfaces lying between the lid (16$_{lid}$) and the base (16$_{base}$). A source of pressurized coolant fluid (210 of FIG. 2*d*) may be coupled to the coolant fluid input port (20*i*) of the thermally conductive plate (16). In a particular version, the source of pressurized fluid coolant includes a micropump (240). One version of the micropump is operated by electric fields rather than by magnetic fields. In another version, the micropump has a thickness less than 0.2 inch.

Another avatar (FIGS. 2*a*, 2*b*, 2*c*, 2*d*) of the invention lies in an array (200) of electronic devices (11, 11$_2$, . . . ). The array (200) comprises (a) a first monolithic solid-state chip (11) including a planar dielectric substrate (12) defining first (12*t*) and second (12*b*) broad surfaces, and also defining electrical conductors (14) lying on the first surface (12*t*). The first monolithic solid state chip (11) produces heat during operation. The array (200) also comprises (b) a first thermally conductive plate (16) including a first broad surface (16t) directly connected to the second surface (12b) of the first solid-state chip (11). The first thermally conductive plate (16) also includes a second broad surface (16b) substantially parallel with the first broad surface (16t). The first thermally conductive plate (16) includes at least one microchannel (20) extending between coolant fluid input (20i) and output (20o) ports lying on the second broad surface (16b) of the first thermally conductive plate (16) and extending between the first (16t) and second (16b) broad surfaces of the first thermally conductive plate (16). The microchannel (20) has a cross-sectional area smaller than about 0.001 square inch. The array (200) further comprises (c) a second monolithic solid-state chip ($11_2$) including a planar dielectric substrate ($12_2$) defining first ($12t$) and second ($12b$) broad surfaces, and also defining electrical conductors (14) lying on the first surface (12t). The second monolithic solid state chip ($11_2$) produces heat during operation. The array further includes (d) a second thermally conductive plate ($16_2$) including a first (16t) broad surface directly connected to the second surface (12b) of the second solid-state chip ($11_2$), and also including a second (12b) broad surface substantially parallel with the first broad surface (12t). The second thermally conductive plate ($16_2$) includes at least one microchannel (20) extending between coolant fluid input (20i) and output (20o) ports lying on the second (16b) broad surface of the second thermally conductive plate ($16_2$) and between the first (16t) and second (16b) broad surfaces of the second thermally conductive plate ($16_2$). The microchannel (20) has a cross-sectional area smaller than about 0.001. A third planar structure (210) is provided. The third planar structure (210) includes a broad first surface (210t) defining at least first (201), second (201), third (203) and fourth (204) fluid ports, the first (201) and second (202) fluid ports being registered with and immediately coupled to the fluid input (20i) and output (20o) ports of the first thermally conductive plate (16), and the third (203) and fourth (204) fluid ports being registered with and immediately coupled to the fluid input (20i) and output (20o) ports of the second thermally conductive plate ($16_2$), so that the second planar surfaces (16b) of the first (16) and second ($16_2$) thermally conductive plates are mounted to or in thermal contact with the first surface (210t) of the third planar structure (210). The third planar structure (210) further defines a closed fluid path (220) extending among at least the first (201), second (202), third (203) and fourth (204) fluid ports, where the term "closed" means that fluid enters and leaves the path by way of the ports and not by way of undesired paths. The third planar structure (210) further includes a micropump (230) contained between the first (210t) and second (210b) broad surfaces of the third planar structure (210) and coupled to the closed fluid path (220), for, when in operation, circulating coolant fluid through the closed fluid path (220) to the coolant fluid input ports (20i) of the first (16) and second ($16_2$) thermally conductive plates, and from the coolant fluid output ports (20o) of the first (16) and second ($16_2$) thermally conductive plates. The circulation of fluid through the thermally conductive plates (16) of the arrayed electronic devices (11, $11_2$, . . . ) tends to transfer heat away from the electronic devices to the third planar structure (210), from which it may be transferred to an ultimate sink.

According to another manifestation or aspect (FIGS. 3a, 3b, 4) of the invention, an array (400) of electronic devices includes at least a first (461) and a second (462) module, first (310) and second ($310_2$) intermediate fluid distribution plates, and a common fluid circulating plate (410). The first module (461) comprises a first monolithic solid-state chip (11) including a planar dielectric substrate defining first and second broad surfaces, and also defining electrical conductors (14) lying on the first surface. The first monolithic solid state chip (11) produces heat during operation. The first module (461) also includes a first thermally conductive plate (16) including a first broad surface directly connected to the second surface of the first solid-state chip (11), and also includes a second broad surface substantially parallel with the first broad surface. The first thermally conductive plate (16) includes at least one microchannel (20) extending between coolant fluid input (20i) and output (20o) ports lying on the second broad surface (16b) of the first thermally conductive plate (16) and extends between the first (16t) and second (16b) broad surfaces of the thermally conductive plate (16). The microchannel (20) has a cross-sectional area smaller than about 0.001 square inch, but may branch into plural parallel microchannels for enhancing heat transfer. The first module (461) further includes a second monolithic solid-state chip ($11_2$) including a planar dielectric substrate ($12_2$) defining first and second broad surfaces, and also defining electrical conductors (14) lying on the first surface. This second solid state chip ($11_2$) also produces heat during operation. The first module (461) includes a second thermally conductive plate ($16_2$) including a first broad surface directly connected to the second surface of the second solid-state chip ($11_2$), and also includes a second broad surface substantially parallel with the first broad surface. The second thermally conductive plate ($16_2$) includes at least one microchannel extending between coolant fluid input and output ports lying on the second broad surface of the second thermally conductive plate ($16_2$) and between the first and second broad surfaces of the second thermally conductive plate ($16_2$). The microchannel has a cross-sectional area smaller than about 0.001 square inch. The second module (462) comprises a first monolithic solid-state chip (11) including a planar dielectric substrate defining first and second broad surfaces, and also defining electrical conductors (14) lying on the first surface. The first solid state chip (11) of the second module (462) produces heat during operation. The second module (462) includes a first thermally conductive plate (16) including a first broad surface directly connected to the second surface of the first solid-state chip (11), and also including a second broad surface substantially parallel with the first broad surface. The first thermally conductive plate (16) includes at least one microchannel extending between coolant fluid input and output ports lying on the second broad surface of the first thermally conductive plate (16) and between the first and second broad surfaces of the first thermally conductive plate (16); the microchannel has a cross-sectional area smaller than about 0.001 square inch. The second module (462) also includes (c) a second monolithic solid-state chip ($11_2$) including a planar dielectric substrate ($16_2$) defining first and second broad surfaces, and also defining electrical conductors (14) lying on the first surface. As with the other solid-state chips (11), the second solid state chip ($11_2$) of the second module (462) produces heat during operation. The second module (462) further includes a second thermally conductive plate ($16_2$) including a first broad surface directly connected to the second surface of the second solid-state chip ($11_2$), and also including a second broad surface substantially parallel with the first broad surface. The second thermally conductive plate ($16_2$) of the second module (462) includes at least one microchannel extending between coolant fluid input and output ports lying on the second broad surface of the second thermally conductive plate (16₂) of the second module (462) and between the first and second broad surfaces of the second thermally conductive plate (16₂). As with the other microchannels, the cross-sectional area is smaller than about 0.001 square inch. The array (400) of electronic devices also includes a first intermediate fluid distribution plate (310) associated with the first module (461). The first intermediate fluid distribution plate (310) of the first module (461) defines a first broad side (210t) and a second broad side (210b). The first intermediate fluid distribution plate (310) includes at least one fluid input port (320₁) and at least one fluid output port (320₂) defined on the second broad side (210b), and at least first (201), second (202), third (203) and fourth (204) fluid ports on the first broad side (210t). The first (201) and second (202) fluid ports of the first intermediate fluid distribution plate (310) of the array (400) of electronic devices are registered with the fluid coolant input (20i) and output (20o) ports of the first thermally conductive plate (16) of the first module (401), and the third (203) and fourth (204) fluid ports of the first intermediate fluid distribution plate (310) are registered with the fluid coolant input (20i) and output (20o) ports of the second thermally conductive plate (16) of the first module (461). The first intermediate fluid distribution plate (310) distributes fluid entering the fluid input port (320₁) of the first intermediate fluid distribution plate (310) to the fluid coolant input ports (20i) of the first (16) and second (16₂) thermally conductive plates of the first module (461). The second intermediate fluid distribution plate (310₂) is associated with the second module (462). The second intermediate fluid distribution plate (310₂) is similar to the first (310), and defines a first broad side (210t) and a second broad side (210b). The second intermediate fluid distribution plate (310₂) includes at least one fluid input port (320₁) and at least one fluid output port (320₂) defined on the second broad side (210b), and also defines at least first (201), second (202), third (203) and fourth (204) fluid ports on the first broad side (210t) thereof. The first (201) and second (202) fluid ports of the second intermediate fluid distribution plate (310₂) are registered with the fluid coolant input (20i) and output (20o) ports of the first thermally conductive plate (16) of the second module (462), and the third (203) and fourth (204) fluid ports of the second intermediate fluid distribution plate (310₂) are registered with the fluid coolant input (20i) and output (20o) ports of the second thermally conductive plate (16) of the second module (462), for distributing fluid entering the fluid input port (320₁) of the second intermediate fluid distribution plate (310₂) to the fluid coolant input ports (20i) of the first (16) and second (16₂) thermally conductive plates (16) of the second module (462). Finally, the array of electronic devices (400) includes a common planar fluid circulating plate (410). The common planar fluid circulating plate (410) defines first (410ut) and second (410Lb) broad surfaces. The first broad surface (410ut) of the common planar fluid circulating plate (410) defines at least first (401), second (402), third (403) and fourth (404) fluid ports. The first (401) and second (402) fluid ports of the common planar fluid circulating plate (410) are registered with the fluid input (320,) and fluid output (320₂) ports defined in (or on) the second broad side (210b) of the first intermediate fluid distribution plate (310), and the third (403) and fourth (404) fluid ports of the common planar fluid circulating plate (410) are registered with the fluid input (320₁) and output (320₂) ports defined in the second broad side (210b) of the second intermediate fluid distribution plate (310₂). The common planar fluid circulating plate (410) further comprises at least one fluid channel (420) coupled to the first (401), second (402), third (403), and fourth (404) fluid ports defined in the first side (410ut), and a micropump (440) lying between the first (410ut) and second (410Lb) broad sides of the common planar fluid circulating plate (410), for circulating coolant fluid through the at least one fluid channel (420). A mounting arrangement or means is coupled to the first and second thermally conductive plates (16) of the first (461) and second (462) modules, to the first (310) and second (310₂) intermediate fluid distribution plates, and to the common planar fluid circulation plate (410), for physically connecting the first (16₁) and second (16₂) thermally conductive plates of the first (461) and second (462) modules, the first (310) and second (310₂) intermediate fluid distribution plates, and the common planar fluid circulation plate (410) together, so that the microchannels (20) of the first (16) and second (16₂) thermally conductive plates of the first module (461), the microchannels (20) of the first (16) and second (16₂) thermally conductive plates of the second module (462), the ports (320₁, 320₂) of the first (310) and second (310₂) intermediate fluid distribution plates, and the at least one fluid channel (420) of the common planar fluid circulation plate (410) form a closed fluid path through which coolant fluid is recirculated by the micropump (440). Ideally, the second broad surfaces (16b) of the first (16₁) and second (16₂) conductive plates of the first (461) and second (462) modules are juxtaposed with the first broad surfaces (210t) of their respective intermediate fluid distribution plates (310, 310₂), and the second surfaces (210b) of the intermediate fluid distribution plates (310, 310₂) are juxtaposed with the first broad surface (410ut) of the common planar fluid circulating plate (410).

What is claimed is:

1. A monolithic solid-state chip including a planar dielectric substrate defining first and second broad surfaces, and also defining electrical conductors lying on said first surface, said solid state chip producing heat during operation;
   a thermally conductive plate including a first broad surface directly connected to said second surface of said solid-state chip, and also including a second broad surface substantially parallel with said first broad surface, said thermally conductive plate including at least one microchannel extending between coolant fluid input and output ports and between said first and second broad surfaces of said thermally conductive plate, said microchannel having a cross-sectional area smaller than about 0.001 square inch; and
   a source of pressurized coolant fluid coupled to said input port of said thermally conductive plate.

2. A monolithic solid-state chip including a planar dielectric substrate defining first and second broad surfaces, and also defining electrical conductors lying on said first surface, said solid state chip producing heat during operation;
   a thermally conductive plate including a first broad surface directly connected to said second surface of said solid-state chip, and also including a second broad surface substantially parallel with said first broad surface, said thermally conductive plate including at least one microchannel extending between coolant fluid input and output ports and between said first and second broad surfaces of said thermally conductive plate, said microchannel having a cross-sectional area smaller than about 0.001 square inch;
   a source of pressurized coolant fluid coupled to said input port of said thermally conductive plate, said source of pressurized coolant fluid including a micropump.

3. A monolithic solid-state chip according to claim 2, wherein said source of pressurized coolant fluid includes a micropump actuated by electric fields and not by magnetic action.

4. A monolithic solid-state chip including a planar dielectric substrate defining first and second broad surfaces, and also defining electrical conductors lying on said first surface, said solid state chip producing heat during operation;
- a thermally conductive plate including a first broad surface directly connected to said second surface of said solid-state chip, and also including a second broad surface substantially parallel with said first broad surface, said thermally conductive plate including at least one microchannel extending between coolant fluid input and output ports and between said first and second broad surfaces of said thermally conductive plate, said microchannel having a cross-sectional area smaller than about 0.001 square inch;
- a source of pressurized coolant fluid coupled to said input port of said thermally conductive plate, said source of pressurized coolant fluid including a micropump, having a thickness no greater than about $2/10$ inch.

5. An array of electronic devices, said array comprising:
- a first monolithic solid-state chip including a planar dielectric substrate defining first and second broad surfaces, and also defining electrical conductors lying on said first surface, said first solid state chip producing heat during operation;
- a first thermally conductive plate including a first broad surface directly connected to said second surface of said first solid-state chip, and also including a second broad surface substantially parallel with said first broad surface, said first thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;
- a second monolithic solid-state chip including a planar dielectric substrate defining first and second broad surfaces, and also defining electrical conductors lying on said first surface, said second solid state chip producing heat during operation;
- a second thermally conductive plate including a first broad surface directly connected to said second surface of said second solid-state chip, and also including a second broad surface substantially parallel with said first broad surface, said second thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;
- a third planar structure, said third planar structure including a broad first surface defining at least first, second, third and fourth fluid ports, said first and second fluid ports being registered with and immediately coupled to said fluid input and output ports of said first thermally conductive plate, and said third and fourth fluid ports being registered with and immediately coupled to said fluid input and output ports of said second thermally conductive plate, said third planar structure further defining a closed fluid path extending among said first, second, third and fourth fluid ports, said third planar structure further comprising a micropump contained between said first and second broad surfaces of said third planar structure and coupled to said closed fluid path, for, when in operation, circulating coolant fluid through said closed fluid path to said coolant fluid input ports of said first and second thermally conductive plates, and from said coolant fluid output ports of said first and second thermally conductive plates.

6. An array according to claim 5, wherein said micropump is actuated by electric fields and not by magnetic action.

7. An array according to claim 5, wherein said micropump has a thickness less than about $2/10$ inch.

8. An array of electronic devices, said array comprising:
- a first module comprising
  - (a) a first monolithic solid-state chip including a planar dielectric substrate defining first and second broad surfaces, and also defining electrical conductors lying on said first surface, said first solid state chip producing heat during operation;
  - (b) a first thermally conductive plate including a first broad surface directly connected to said second surface of said first solid-state chip, and also including a second broad surface substantially parallel with said first broad surface, said first thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;
  - (c) a second monolithic solid-state chip including a planar dielectric substrate defining first and second broad surfaces, and also defining electrical conductors lying on said first surface, said second solid state chip producing heat during operation;
  - (d) a second thermally conductive plate including a first broad surface directly connected to said second surface of said second solid-state chip, and also including a second broad surface substantially parallel with said first broad surface, said second thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;
- a second module, comprising
  - (a) a first monolithic solid-state chip including a planar dielectric substrate defining first and second broad surfaces, and also defining electrical conductors lying on said first surface, said first solid state chip producing heat during operation;
  - (b) a first thermally conductive plate including a first broad surface directly connected to said second surface of said first solid-state chip, and also including a second broad surface substantially parallel with said first broad surface, said first thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;
  - (c) a second monolithic solid-state chip including a planar dielectric substrate defining first and second broad surfaces, and also defining electrical conductors lying on said first surface, said second solid state chip producing heat during operation;

(d) a second thermally conductive plate including a first broad surface directly connected to said second surface of said second solid-state chip, and also including a second broad surface substantially parallel with said first broad surface, said second thermally conductive plate including at least one microchannel extending between coolant fluid input and output ports lying on said second broad surface of said first thermally conductive plate and between said first and second broad surfaces of said thermally conductive plate, said microchannel having a cross-sectional area smaller than about 0.001 square inch;

a first intermediate fluid distribution plate associated with said first module, said first intermediate fluid distribution plate defining a first broad side and a second broad side, said first intermediate fluid distribution plate including at least one fluid input port and at least one fluid output port defined on said second broad side, said intermediate fluid distribution plate also defining at least first, second, third and fourth fluid ports on said first broad side, said first and second fluid ports of said first intermediate fluid distribution plate being registered with said fluid coolant input and output ports of said first thermally conductive plate of said first module, and said third and fourth fluid ports of said first intermediate fluid distribution plate being registered with said fluid coolant input and output ports of said second thermally conductive plate of said first module, for distributing fluid entering said fluid input port of said first intermediate fluid distribution plate to said fluid coolant input ports of said first and second thermally conductive plates of said first module;

a second intermediate fluid a distribution plate associated with said second module, said second intermediate fluid distribution plate defining a first broad side and a second broad side, said second intermediate fluid distribution plate including at least one fluid input port and at least one fluid output port defined on said second broad side, said second intermediate fluid distribution plate also defining at least first, second, third and fourth fluid ports on said first broad side, said first and second fluid ports of said second intermediate fluid distribution plate being registered with said fluid coolant input and output ports of said first thermally conductive plate of said second module, and said third and fourth fluid ports of said second intermediate fluid distribution plate being registered with said fluid coolant input and output ports of said second thermally conductive plate of said second module, for distributing fluid entering said fluid input port of said second intermediate fluid distribution plate to said fluid coolant input ports of said first and second thermally conductive plates of said second module;

a common planar fluid circulating plate, said common planar fluid circulating plate defining first and second broad surfaces, said first broad surface of said common planar fluid circulating plate defining at least first, second, third and fourth fluid ports, said first and second fluid ports of said common planar fluid circulating plate being registered with said fluid input and fluid output ports defined in said second broad side of said first intermediate fluid distribution plate, and said third and fourth fluid ports of said common planar fluid circulating plate being registered with said fluid input and output ports defined in said second broad side of said second intermediate fluid distribution plate, said common planar fluid circulating plate further comprising at least one fluid channel coupled to said first, second, third, and fourth fluid ports defined in said first side, and a micropump lying between said first and second broad sides of said common planar fluid circulating plate, for circulating fluid through said at least fluid channel; and mounting means coupled to said first and second thermally conductive plates of said first and second modules, to said first and second intermediate fluid distribution plates, and to said common planar fluid circulation plate, for physically connecting said first and second thermally conductive plates of said first and second modules, said first and second intermediate fluid distribution plates, and said common planar fluid circulation plate together, so that said microchannels of said first and second thermally conductive plates of said first module, said microchannels of said first and second thermally conductive plates of said second module, said ports of said first and second intermediate fluid distribution plates, and said at least one fluid channel of said common planar fluid circulation plate form a closed fluid path through which coolant fluid is recirculated by said micropump.

9. An array according to claim 8, wherein said micropump is actuated by electric fields and not by magnetic fields.

10. An array according to claim 8, wherein said micropump has a thickness less than about 2/10 inch.

* * * * *